(12) United States Patent
Walczak et al.

(10) Patent No.: US 9,642,252 B2
(45) Date of Patent: May 2, 2017

(54) NANOTUBE DISPERSANTS AND DISPERSANT FREE NANOTUBE FILMS THEREFROM

(71) Applicant: University of Florida Research Foundation, Inc., Gainesville, FL (US)

(72) Inventors: Ryan M. Walczak, Blacksburg, VA (US); John R. Reynolds, Dunwoody, GA (US); Andrew Gabriel Rinzler, Newberry, FL (US); Andrew M. Spring, East Riding of Yorkshire (GB); Svetlana V. Vasilyeva, Gainesville, FL (US); Pooja Wadhwa, Chandler, AZ (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 15/065,775

(22) Filed: Mar. 9, 2016

(65) Prior Publication Data
US 2016/0185602 A1    Jun. 30, 2016

Related U.S. Application Data

(62) Division of application No. 14/009,922, filed as application No. PCT/US2012/031950 on Apr. 3, 2012.

(60) Provisional application No. 61/471,582, filed on Apr. 4, 2011.

(51) Int. Cl.
| | |
|---|---|
| *B05D 1/04* | (2006.01) |
| *B05D 1/28* | (2006.01) |
| *B05D 1/18* | (2006.01) |
| *B05D 3/00* | (2006.01) |
| *H05K 1/09* | (2006.01) |
| *C08J 3/02* | (2006.01) |
| *C09D 5/02* | (2006.01) |
| *C09D 7/12* | (2006.01) |
| *C01B 31/02* | (2006.01) |
| *C01B 31/04* | (2006.01) |
| *C09D 11/30* | (2014.01) |
| *C09D 11/52* | (2014.01) |
| *C09D 101/02* | (2006.01) |
| *C09D 147/00* | (2006.01) |
| *B82Y 30/00* | (2011.01) |
| *B82Y 40/00* | (2011.01) |
| *C08K 7/24* | (2006.01) |

(52) U.S. Cl.
CPC .............. *H05K 1/092* (2013.01); *B05D 1/04* (2013.01); *B05D 1/18* (2013.01); *B05D 1/28* (2013.01); *B05D 3/007* (2013.01); *B82Y 30/00* (2013.01); *B82Y 40/00* (2013.01); *C01B 31/0273* (2013.01); *C01B 31/0484* (2013.01); *C08J 3/02* (2013.01); *C08K 7/24* (2013.01); *C09D 5/027* (2013.01); *C09D 7/1291* (2013.01); *C09D 11/30* (2013.01); *C09D 11/52* (2013.01); *C09D 101/02* (2013.01); *C09D 147/00* (2013.01); *C08J 2300/10* (2013.01); *H05K 2201/0323* (2013.01)

(58) Field of Classification Search
CPC ........ C01B 31/0273; B05D 1/18; B05D 1/28; B05D 1/04
See application file for complete search history.

(56) References Cited

U.S. PATENT DOCUMENTS

| | | | |
|---|---|---|---|
| 4,673,473 | A | 6/1987 | Ang et al. |
| 5,238,674 | A | 8/1993 | Vercoulen et al. |
| 5,417,757 | A | 5/1995 | Merienne et al. |
| 5,456,943 | A | 10/1995 | Guhl et al. |
| 5,560,898 | A | 10/1996 | Uchida et al. |
| 5,853,877 | A | 12/1998 | Shibuta |

(Continued)

FOREIGN PATENT DOCUMENTS

| | | |
|---|---|---|
| CN | 1214710 A | 4/1999 |
| CN | 1466788 A | 1/2004 |

(Continued)

OTHER PUBLICATIONS

Perov et al., Chem. Commun., 2003 pp. 2904-2905.*

(Continued)

*Primary Examiner* — Robert Harlan
(74) *Attorney, Agent, or Firm* — Wolf, Greenfield & Sacks, P.C.

(57) ABSTRACT

A degradable polymeric nanotube (NT) dispersant comprises a multiplicity of NT associative groups that are connected to a polymer backbone by a linking group where there are cleavable groups within the polymer backbone and/or the linking groups such that on a directed change of conditions, bond breaking of the cleavable groups results in residues from the degradable polymeric NT dispersant in a manner where the associative groups are uncoupled from other associative groups, rendering the associative groups monomelic in nature. The degradable polymeric nanotube (NT) dispersant can be combined with carbon NTs to form a NT dispersion that can be deposited to form a NT film, or other structure, by air brushing, electrostatic spraying, ultrasonic spraying, ink-jet printing, roll-to-roll coating, or dip coating. The deposition can render a NT film that is of a uniform thickness or is patterned with various thicknesses. Upon deposition of the film, the degradable polymeric nanotube (NT) dispersant can be cleaved and the cleavage residues removed from the film to yield a film where contact between NTs is unencumbered by dispersants, resulting in highly conductive NT films.

20 Claims, 7 Drawing Sheets

(56) References Cited

U.S. PATENT DOCUMENTS

| | | |
|---|---|---|
| 6,127,061 A | 10/2000 | Shun et al. |
| 6,232,706 B1 | 5/2001 | Dai et al. |
| 6,331,262 B1 | 12/2001 | Haddon et al. |
| 6,369,934 B1 | 4/2002 | Bechinger et al. |
| 6,566,983 B2 | 5/2003 | Shin |
| 6,590,231 B2 | 7/2003 | Watanabe et al. |
| 6,645,455 B2 | 11/2003 | Margrave et al. |
| 6,831,017 B1 | 12/2004 | Li et al. |
| 6,903,365 B1 | 6/2005 | Nihei |
| 6,936,233 B2 | 8/2005 | Smalley et al. |
| 7,037,619 B2 | 5/2006 | Yamaura et al. |
| 7,060,241 B2 | 6/2006 | Glatkowski |
| 7,122,165 B2 | 10/2006 | Wong et al. |
| 7,261,852 B2 | 8/2007 | Rinzler et al. |
| 7,351,444 B2 | 4/2008 | Wang et al. |
| 7,572,743 B2 | 8/2009 | Rinzler et al. |
| 7,704,479 B2 | 4/2010 | Rinzler et al. |
| 7,776,444 B2 | 8/2010 | Rinzler et al. |
| 7,972,699 B2 | 7/2011 | Rinzler et al. |
| 8,168,965 B2 | 5/2012 | Rinzler et al. |
| 9,368,291 B2 | 6/2016 | Rinzler et al. |
| 2002/0172639 A1 | 11/2002 | Horiuchi et al. |
| 2002/0176650 A1 | 11/2002 | Zhao et al. |
| 2003/0122111 A1 | 7/2003 | Glatkowski |
| 2004/0066094 A1 | 4/2004 | Suzuki et al. |
| 2004/0197546 A1 | 10/2004 | Rinzler et al. |
| 2004/0197638 A1 | 10/2004 | McElrath et al. |
| 2004/0198850 A1 | 10/2004 | Connor et al. |
| 2005/0026411 A1 | 2/2005 | Tanamoto et al. |
| 2005/0098437 A1 | 5/2005 | Shiepe |
| 2005/0100960 A1 | 5/2005 | Dai et al. |
| 2005/0142428 A1 | 6/2005 | Daimon et al. |
| 2005/0147553 A1 | 7/2005 | Wong et al. |
| 2005/0199894 A1 | 9/2005 | Rinzler et al. |
| 2005/0202578 A1 | 9/2005 | Yaniv et al. |
| 2005/0266162 A1 | 12/2005 | Luo et al. |
| 2006/0029537 A1 | 2/2006 | Zhang et al. |
| 2006/0172179 A1 | 8/2006 | Gu et al. |
| 2006/0220251 A1 | 10/2006 | Kloster et al. |
| 2006/0223991 A1 | 10/2006 | Zhang et al. |
| 2006/0237805 A1 | 10/2006 | Segal et al. |
| 2007/0092787 A1 | 4/2007 | Chen |
| 2007/0114573 A1 | 5/2007 | Han et al. |
| 2007/0141345 A1 | 6/2007 | Rinzler et al. |
| 2007/0172718 A1 | 7/2007 | Lee et al. |
| 2007/0184972 A1 | 8/2007 | Roev et al. |
| 2008/0020923 A1 | 1/2008 | Debe et al. |
| 2008/0182155 A1 | 7/2008 | Choi et al. |
| 2008/0210950 A1 | 9/2008 | Sung |
| 2009/0138649 A1 | 5/2009 | Chew et al. |
| 2009/0246625 A1 | 10/2009 | Lu |
| 2010/0097742 A1 | 4/2010 | Adzic et al. |
| 2010/0272981 A1 | 10/2010 | Rinzler et al. |
| 2011/0186785 A1 | 8/2011 | Kato et al. |
| 2012/0031852 A1 | 2/2012 | Aglietto |
| 2012/0045688 A1 | 2/2012 | Liu et al. |
| 2012/0115049 A1 | 5/2012 | Rinzler et al. |
| 2013/0026029 A1 | 1/2013 | Kayeart et al. |
| 2013/0105304 A1 | 5/2013 | Kaczur et al. |
| 2013/0146470 A1 | 6/2013 | Wang et al. |
| 2013/0273446 A1 | 10/2013 | Rinzler et al. |
| 2014/0083752 A1 | 3/2014 | Walczak et al. |
| 2016/0192484 A1 | 6/2016 | Walczak et al. |
| 2016/0281245 A1 | 9/2016 | Rinzler et al. |

FOREIGN PATENT DOCUMENTS

| | | |
|---|---|---|
| CN | 1546431 A | 11/2004 |
| CN | 2893940 Y | 4/2007 |
| CN | 100595953 C | 3/2010 |
| CN | 101721944 A | 6/2010 |
| EP | 1878763 A2 | 1/2008 |
| JP | H06-038265 U | 5/1994 |
| JP | H07-048111 A | 2/1995 |
| JP | 2000-086216 A | 3/2000 |
| JP | 2000-203821 A | 7/2000 |
| JP | 2001-035362 A | 2/2001 |
| JP | 2002-305087 A | 10/2002 |
| JP | 2002-338221 A | 11/2002 |
| JP | 2002-346996 A | 12/2002 |
| JP | 2003-146632 A | 5/2003 |
| JP | 2003-178816 A | 6/2003 |
| JP | 2003-209270 A | 7/2003 |
| JP | 2003-288835 A | 10/2003 |
| JP | 2004-042253 A | 2/2004 |
| JP | 2004-158290 A | 6/2004 |
| JP | 2004-315297 A | 11/2004 |
| JP | 2004-537174 A | 12/2004 |
| JP | 2005-047763 A | 2/2005 |
| JP | 2005-057012 A | 3/2005 |
| JP | 2005-294109 A | 10/2005 |
| JP | 2006-513557 A | 4/2006 |
| JP | 2006-265151 A | 10/2006 |
| JP | 2007-515364 A | 6/2007 |
| JP | 2007-258030 A | 10/2007 |
| JP | 2008-505832 A | 2/2008 |
| JP | 2008-542980 A | 11/2008 |
| JP | 2009-093983 A | 4/2009 |
| JP | 2009-533227 A | 9/2009 |
| JP | 2009-536911 A | 10/2009 |
| JP | 2010-506824 A | 3/2010 |
| JP | 2010-515779 A | 5/2010 |
| JP | 2010-232040 A | 4/2012 |
| KR | 10-2001-0101692 | 11/2001 |
| KR | 10-2007-0730197 B1 | 6/2007 |
| KR | 2007-0100594 A | 10/2007 |
| RU | 2303836 C1 | 7/2007 |
| WO | WO 97/00925 A1 | 1/1997 |
| WO | WO 03/107451 A2 | 12/2003 |
| WO | WO 2004/009884 A1 | 1/2004 |
| WO | WO 2004/040590 A2 | 5/2004 |
| WO | WO 2004/109837 A2 | 12/2004 |
| WO | WO 2005/014889 A2 | 2/2005 |
| WO | WO 2005/029528 A1 | 3/2005 |
| WO | WO 2005/044723 A2 | 5/2005 |
| WO | WO 2005/083751 A1 | 9/2005 |
| WO | WO 2006/001790 A1 | 1/2006 |
| WO | WO 2007/004758 A1 | 1/2007 |
| WO | WO 2007/101906 A1 | 3/2007 |
| WO | WO 2007/095492 A2 | 8/2007 |
| WO | WO 2008/034939 A1 | 3/2008 |
| WO | WO 2008/046010 A2 | 4/2008 |
| WO | WO 2008/054473 A2 | 5/2008 |
| WO | WO 2010/102759 A1 | 9/2010 |
| WO | WO 2010/126767 A2 | 11/2010 |

OTHER PUBLICATIONS

International Search Report and Written Opinion mailed Dec. 10, 2008 in connection with Application No. PCT/US2007/078230.
International Preliminary Report on Patentability mailed Mar. 17, 2009 in connection with Application No. PCT/US2007/078230.
Partial European Search Report mailed Oct. 5, 2016 in connection with Application No. EP 10770141.9.
International Search Report and Written Opinion mailed Nov. 19, 2010 in connection with Application No. PCT/US2010/031995.
International Preliminary Report on Patentability mailed Nov. 10, 2011 in connection with Application No. PCT/US2010/031995.
International Search Report and Written Opinion mailed Jun. 3, 2005 in connection with Application No. PCT/US2005/005575.
International Preliminary Report on Patentability mailed Apr. 13, 2006 in connection with Application No. PCT/US2005/005575.
International Search Report and Written Opinion mailed Apr. 5, 2007 in connection with Application No. PCT/US2006/036723.
International Preliminary Report on Patentability mailed Mar. 26, 2008 in connection with Application No. PCT/US2006/036723.
International Search Report and Written Opinion mailed Sep. 26, 2008 in connection with Application No. PCT/US2007/081770.
International Preliminary Report on Patentability mailed Apr. 22, 2009 in connection with Application No. PCT/US2007/081770.
International Search Report and Written Opinion mailed Mar. 10, 2015 in connection with Application No. PCT/US14/66714.

(56) References Cited

OTHER PUBLICATIONS

International Preliminary Report on Patentability mailed Jun. 2, 2016 in connection with Application No. PCT/US14/66714.
Extended European Search Report mailed Jun. 26, 2014 in connection with Application No. EP 11847983.1.
International Search Report and Written Opinion mailed Aug. 28, 2012 in connection with Application No. PCT/US2011/065569.
International Preliminary Report on Patentability mailed Jun. 27, 2013 in connection with Application No. PCT/US2011/065569.
Extended European Search Report mailed Aug. 6, 2014 in connection with Application No. EP 12767499.2.
International Preliminary Report on Patentability dated Oct. 17, 2013 in connection with Application No. PCT/US2012/031950.
Office communication mailed Mar. 19, 2015 in connection with Application No. CN 2010800191988.
[No Author Listed], New ink-jet technology for the formation of ultra fine dots less than 1/1000 the size of currently achieved. National Institute of Advanced Industrial Science and Technology (AIST). Press Release. Apr. 1, 2002. http://www.aist.go.jp/alst_e/new_research/20020401/20020401.html [last accessed Aug. 23, 2005]. 3 pages.
[No Author Listed], Product Information Sheet for Triton X-100. CAS No. 9002-93-1. Sigma-Aldrich. 2 pages. Year: 2000.
Aricò et al., DMFCs: From Fundamental Aspects to Technology Development. Fuel Cells. 2001;1(2):133-61.
Barazzouk et al., Single-Wall Carbon Nanotube Films for Photocurrent Generation. A Prompt Response to Visible-Light Irradiation. J Phys Chem B. 2004;108:17015-8.
Bethune et al., Cobalt-catalysed growth of carbon nanotubes with single-atomic-layer walls. Lett Nature. 1993;363:605-7.
Beverskog et al., Revised Pourbaix diagrams for nickel at 25-300° C. Corros Sci. May 1997;39(5):969-80.
Bidault et al., Review of gas diffusion cathodes for alkaline fuel cells. J Power Sources. 2009;187:39-48.
Bradley et al., Short-channel effects in contact-passivated nanotube chemical sensors. Appl Phys Lett. 2003;83(18):3821-3.
Butt, Carbon-NanoTube Transistors. Purdue University, School of Electrical and Computer Engineering. 6 pages. Year: 2000.
Chen et al., Chemically doped double walled carbon nanotubes. Cylindrical Molecular Capacitors. Jun. 27, 2003;90(25):257403.1-4.
Du et al., Effect of nanotube alignment on percolation conductivity in carbon nanotube/polymer composites. Phys Rev B. 2005;72:12140.1-4.
Du et al., Preparation and preliminary property study of carbon nanotubes films by electrophoretic deposition. Mater Lett. 2002;57:434-8.
Fan et al., Self-Oriented Regular Arrays of Carbon Nanotubes and their Field Emission Properties. Science. Jan. 22, 1999;283:512-4.
Feng et al., Water Soluble Multi-Walled Nanotube and its Film Characteristics. Chin Phys Lett. 2003;20(5):753-5.
Ferrer-Anglada et al., Conducting transparent thin films based on Carbon Nanotubes—Conducting Polymers. Electronics Properties of Synthetic Nanostructures. Ed. Kuzmany et al. CP723. 2004;591-4.
Ferrer-Anglada et al., Synthesis and characterization of carbon nanotube-conducting polymer thin films. Diamond Rel Mater. 2004;13:256-60.
Fischer, Magnetically aligned single wall carbon nanotube films:Preferred orientation and anisotropic transport properties. J Appl Phys. Feb. 15, 2003;93(4):2157-63.
Girishkumar et al., Single-wall carbon nanotube-based proton exchange membrane assembly for hydrogen fuel cells. Langmuir. 2005;21(18):8487-94.
Godbole et al., Deposition and characterization of silver nano-films by a novel solid liquid interface reaction technique (SLIRT). Mater Lett. 2005;59:1958-61.
Gong et al., Nitrogen-Doped Carbon Nanotube Arrays with High Electrocatalytic Activity for Oxygen Reduction. Sci. Feb. 6, 2009;323:760-4.

Guo et al., Multi-layer LB films of single-wall carbon nanotubes. Physica B. 2002;323:235-6.
Huang et al., Growth of aligned SWNT arrays from water-soluble molecular cluster for nanotube device fabrication. Phys Chem Chem Phys. 2004;6:1077-9.
Huang et al., Self-organizing high-density single-walled carbon nanotube arrays from surfactant suspensions. Nanotech. 2004;15:1450-4.
Jacquemin et al., Doping mechanism in single-wall carbon nanotubes studied by optical absorption. Synth Metal. 2000;115:283-7.
Kaempgen et al., Transparent CNT Composites, Molecular Nanostructures. XVII International Winterschool/Euroconference on Electronic Properties of Novel Materials. 2003;554-8.
Kataura et al., Optical Properties of Single-Wall Carbon Nanotubes. Synth Metal. 1999;103:2555-8.
Kavan et al., Electrochemical Tuning of Electronic Structure of Single-Walled Carbon Nanotubes: In-situ Raman and Vis-NIR Study. J Phys Chem. 2001;105:10764-71.
Kazaoui et al., Electrochemical tuning of electronic states in single-wall carbon nanotubes studies by in situ absorption spectroscopy and ac resistance. Appl Phys Lett. May 28, 2001;78(22):3433-5.
Kim et al., Homogenous and structurally controlled thin films of single-wall carbon nanotubes by the Langmuir-Blodgett technique. Synth Metal. 2003;(135-6):747-8.
Kim et al., Langmuir-Blodgett films of single-wall carbon nanotubes: layer-by-layer deposition and in-place orientation of tubes. Jap J Appl Phys. 2003;43(12):7629-34.
Kinoshita, Carbon: Electrochemical and physicochemical properties. John Wiley & Sons. 1988;372-3.
Kongkanand et al., Single-Wall Carbon Nanotubes Supported Platinum Nanoparticles with Improved Electrocatalytic Activity for Oxygen Reduction Reaction. Langmuir. 2006;22(5):2392-6.
Le Goff et al., From hydrogenases to noble metal-free catalytic nanomaterials for H2 production and uptake. Science. Dec. 4, 2009;326(5958):1384-7. doi: 10.1126/science.1179773.
Lee et al., Single Wall Carbon Nanotubes for p-Type Ohmic Contacts to GaN Light-Emitting Diodes. Nano Lett. 2004;4(5):911-4.
Li et al., Carbon nanotube film by filtration as cathode catalyst support for proton-exchange membrane fuel cell. Langmuir. Oct. 11, 2005;21(21):9386-9.
Lijima, Helical microtubules of graphitic carbon. Lett Nature. 1991;354:56-8.
Liu et al., Electrochemical Characterization of Films of Single-Walled Carbon Nanotubes and Their Possible Application in Supercapacitors. Electrochem Solid-State Lett. 1999;11:577-8.
Meitl et al., Solution Casting and Transfer Printing Single-Walled Carbon Nanotube Films. Nano Lett. 2004;4(9):1643-7.
Merki et al., Amorphous molybdenum sulfide films as catalysts for electrochemical hydrogen production in water. Chem Sci. 2011;2:1262-7.
Mickelson et al., Fluorination of single-wall carbon nanotubes. Chem Phys Lett. 1998;296:188-94.
Minami, Optical properties of semiconducting and metallic single wall carbon nanotubes: effects of doping and high pressure. Synth Metal. 2001;116:405-9.
Miranda et al., Design of a chemical sensor based on a Carbon Nanotube functionalized with DNA. PASEO 2009. Buenos Aires, Argentina. Mar. 2009. 7 pages.
Misra et al., Hydrogen evolution on hydrophobic aligned carbon nanotube arrays. ACS Nano. Dec. 22, 2009;3(12):3903-8. doi: 10.1021/nn900878d.
Nguyen et al., Synthesis of multi-walled carbon nanotubes for NH3 gas detection. Physica E. 2007;37:54-7.
Nikolaev et al., Gas-phase catalytic growth of single-walled carbon nanotubes from carbon monoxide. Chem Phys Lett. 1999;313:91-7.
Nilsson et al., Scanning field emission from patterned carbon nanotube films. Appl Phys Lett. Apr. 10, 2000;76(15):2071-3.
Nose et al., Electrochemical oxidation of highly oriented pyrolytic graphite in sulphuric acid solution under potential pulse condition. Fuel Cells. Jun. 2009;9(3):284-90.

(56) References Cited

OTHER PUBLICATIONS

Novak et al., Macroelectronic application of carbon nanotube networks. Solid-State Electron. 2004;48:1753-6.
Oh et al., Organic molecules as mediators and catalysts for photocatalytic and electrocatalytic CO 2 reduction. Chem Soc Rev. 2013;42(6):2253-61.
Papakonstantinou et al., Fundamental electrochemical properties of carbon nanotube electrodes. Fullerenes Nanotubes Carb Nanostruct. 2005 Dep;13:91-108.
Pawlowski et al., Novel photoacid generators. Key components for the progress of chemically amplified photoresist systems. J Photopolymer Sci Tech. 1991;4(3):389-402.
Peltola et al., Carbon-Nanotube Transparent Electrodes for Flexible Displays. Info Displays. Feb. 2007;2-5.
Peng et al., Carbon Nanotube Chemical and Mechanical Sensors. Conference Paper for the 3rd International Workshop on Structural Health Monitoring. Stanford, CA. Sep. 12-14, 2001. 8 pages.
Powell et al., A laboratory exercise introducing students to the Pourbaix diagram for cobalt. J Chem Educ. 1987;64(2):165-7.
Prosini et al., Electrochemical studies of hydrogen evolution, storage and oxidation on carbon nanotube electrodes. J Power Sources. 2003;118(1):265-9.
Rai et al., Dispersions of Functionalized Single-Walled Carbon Nanotubes in Strong Acids: Solubility and Rheology. J Nanosci Nanotech. 2007;7:3378-85.
Raudino et al., Modeling of low-temperature depolymerization of poly(methyl methacrylate) promoted by ion beam. J Chem Phys. Jul. 22, 1999;111(4):1721-31.
Rinzler et al., Large-scale purification of single-wall carbon nanotubes: process, product, and characterization. Appl Phys A. 1998;67:29-37.
Robinson et al., Improved chemical detection using single-walled carbon nanotube network capicitors. Sensors Actuators A. 2007;135:309-14.
Ryan et al., Novel sub-ceiling temperature rapid depolymerization-repolymerization reactions of cyanoacrylate polymers. Macromolec Rapid Comm 1996;17:217-27.
Sakakibara et al., Near-infrared saturable absorption of single-wall carbon nanotubes prepared by laser ablation method. Jap J Appl Phys. 2003;42(5A):L494-6. Abstract.
Sreekumar et al., Single-Wall Carbon Nanotube Films. Chem Mater. 2003;15:175-8.
Urbonaite, Synthesis and characterisation of carbide derived carbons. Doctoral Thesis, Department of Physical, Inorganic and Structural Chemistry, Stockholm University. 2008:1-82.
Villalpando-Paez et al., Synthesis and characterization of long strands of nitrogen-doped single-walled carbon nanotubes. Chem Phys Lett. 2006;424:345-52.
Wagner et al., Change of electrochemical impedance spectra (EIS) with time during CO-poisoning of the Pt-anode in a membrane fuel cell. J Power Sources. 2004;127:341-7.
Wang et al., Light Scattering Study on SWNTs Solutions. American Physical Society. Annual APS Mar. Meeting 2003. Mar. 3-7, 2003. Meeting Session C1, Poster Session I. Abstract No. C1.014. 1 page.
Ward et al., A nonvolatile nanoelectromechanical memory element utilizing a fabric of carbon nanotubes. Non-Volatile Memory Technology Symposium. 2004;34-8. Abstract.
Winther-Jensen et al., Conducting polymer composite materials for hydrogen generation. Adv Mater. Apr. 18, 2010;22(15):1727-30. doi: 10.1002/adma.200902934.
Wu et al., Green Power Source Material. Chemical Industry Publishing House. 2008: 268.
Wu et al., Transparent Conductive Carbon Nanotube Films Science. Aug. 27, 2004;305:1273-6.
Yamada et al., Toward Environmentally Friendly Photolithographic Materials: A New Class of Water-Soluble Photoresists. Macromolec. 2004;37(2):377-84.
Yang et al., Hydrogen generation using PPy-FMS modified PVDF membrane and other substrates. Synth Metals. 2005;154:69-72.
Yuan et al., Property Control of Single Walled Carbon Nanotubes and Their Devices. Dissertation. Department of Chemistry, Duke University. Dec. 2008. 167 pages.
Zhang et al., Microwave-assisted synthesis of Pt/CNT nanocomposite electrocatalysts for PEM fuel cells. Nanoscale. Feb. 2010;2(2):282-6. doi: 10.1039/b9nr00140a. Epub Oct. 12, 2009.
International Search Report dated Oct. 19, 2012 from corresponding International Application No. PCT/US2012/031950.
Written Opinion dated Oct. 19, 2012 from corresponding International Application No. PCT/US2012/031950.
Office communication mailed Jan. 26, 2016 for Application No. JP 2014-503905.
Choi et al., Pyrene-containing polystyrene segmented copolymer from nitroxide mediated polymerization and its application for the noncovalent functionalization of as-prepared multiwalled carbon nanotubes. Eur Polym J. Jul. 11, 2008;44:3087-95.
Liu et al., Stable non-covalent functionalization of multi-walled carbon nanotubes by pyrene-polyethylene glycol through [pi]—[pi] stacking. New Journal of Chem. 2009;33:1017-1024.
Petrov et al., Noncovalent functionalization of multi-walled carbon nanotubes by pyrene containing polymers. Chem Commun (Camb). Dec. 7, 2003;(23):2904-5.
Salzmann et al., Highly hydrophilic and stable polypeptide/single-wall carbon nanotube conjugates. J Mater Chem. 2008;18:1977-1983.
Xue et al., The preparation of highly water-soluble multi-walled carbon nanotubes by irreversible noncovalent functionalization with a pyrene-carrying polymer. Nanotechnology. May 28, 2008;19(21):215604. doi: 10.1088/0957-4484/19/21/215604. Epub Apr. 21, 2008.
Yang et al., Functionalization of multiwalled carbon nanotubes by pyrene-labeled hydroxypropyl cellulose. J Phys Chem B. Oct. 16, 2008;112(41):12934-9. doi: 10.1021/jp805424f. Epub Sep. 23, 2008.
Yang et al., Preparation and characterization of water-soluble single-walled carbon nanotubes by hybridization with hydroxypropyl cellulose derivatives. Ind Eng Chem Res. 2010;49(6):2747-51.
Zhang, W. et al. 'Electronic Interactions and Polymer Effect in the Functionalization and Salvation of Carbon Nanotube by Pyrene- and Ferrocene-Containing Poly(I-alkynes).' In: Macromolecules, 2008, vol. 41, pp. 701-707. (-) See abstract, scheme 1.

\* cited by examiner

NANOTUBE DISPERSANTS AND DISPERSANT FREE NANOTUBE FILMS THEREFROM

RELATED APPLICATIONS

This application claims the benefit under 35 U.S.C. §120 of U.S. application Ser. No. 14/009,922, filed on Dec. 10, 2013 which application is the national phase of International Application No. PCT/US2012/031950, filed on Apr. 3, 2012, which in turn claims priority under 35 U.S.C. §119(e) to U.S. Provisional Application Ser. No. 61/471,582, filed on Apr. 4, 2011 which applications are hereby incorporated by reference to the maximum extent allowable by law.

BACKGROUND OF INVENTION

Carbon nanotubes (NTs) have received significant attention for technological applications because of their desirable properties, which include high electrical conductivity, high carrier mobility, and high mechanical strength; and due to their ability to be processed into various forms such as fibers and thin films. NTs in the form of networks and films have been proposed as electrodes for several types of devices, including: polymeric supercapacitors; transparent electrodes for organic light emitting diodes and organic photovoltaic devices; and organic electrodes for organic light emitting diodes, organic photovoltaic devices, and organic electrochromic devices. NT dispersions within an electroactive organic matrix, such as, poly(3-alkylthiophene)s and poly (phenylene vinylene)s, have demonstrated a potential to act as an electroactive component within a bulk heterojunction photovoltaic device. Recent work has demonstrated that dispersing NTs within an organic polymeric matrix, such as polystyrene and a polyacrylate, dramatically increases its strength, toughness, and durability in addition to its introduction and augmentation of other properties. Therefore, dispersion of NTs into electroactive organic materials is promising as active sites of: charge storing supercapacitors/batteries; solar cells; electrochromic fiber and film-based devices; and light emitting devices, which, aside from producing enhanced electronic properties, can result in durable and robust materials.

Critical to the commercial success of NT films is an ability to process the films on a large scale via methods such as printing, roll-to-roll coating, and spraying. Such processing methods require solutions or suspensions of NTs that are well-dispersed and where the homogeneous solution or suspension can be maintained for an extended period of time. Examples of such carbon NT dispersants include ionic and non-ionic surfactants, DNA, conjugated polymers, and non-conjugated polymers that contain polycyclic aromatic groups, such as pyrene and porphyrins. NT films for high-end electronic applications require a low sheet resistance (<300 Ohms/sq) and, for those applications involving transparent electrodes, the low sheet resistance must be accompanied by a high transmittance (above 75%) of electromagnetic radiation in the wavelength region of interest. However, NT thin films that have been deposited as dispersions, using techniques that are amenable to large scale production, have resulted in sub-optimal transparency and/or conductivity, usually with a resistivity above 1,000 Ohms/sq when having acceptable transmittance levels. Many dispersants, especially polymeric dispersants, have been designed to blend NTs into polymer composites as reinforcement materials but are not appropriate for the formation of transparent conductive thin-film electrodes. Typically, NT dispersants are irreversibly bound to the nanotubes, where the NT dispersant exceeds the content of the NTs in the thin film and have not demonstrated the capability for use in high-end electronic applications.

Therefore, a need remains for a NT dispersant that allows the formation of a stable dispersion of carbon NTs and that can be easily removed to form a thin film without damaging or detracting from the structure and properties possible for NTs. Additionally, these dispersants would be useful for formation of nanotube composite materials for electroactive and related devices including: electroluminescent devices; photovoltaics; electrochromic films and fibers; field-effect transistors; batteries; capacitors; and supercapacitors.

SUMMARY OF INVENTION

An embodiment of the invention is directed to a degradable polymeric carbon nanotube (NT) dispersant comprising a multiplicity of NT associative groups coupled to a polymer backbone by linking groups and having a plurality of cleavable groups situated between NT associative groups. In this manner, individual NT associative groups are separated from other NT associative groups, where cleavage of the cleavable groups leaves residual fragments from the polymeric carbon nanotube (NT) dispersant that have no more than one NT associative group. The NT associative group comprises a polycyclic aromatic group capable of being non-covalently associated with a NT or other graphene structure. The degradable polymeric NT dispersant is soluble in at least one solvent. The cleavable groups comprise a functional group that can be cleaved by a change in temperature, a change in illumination, addition of one or more chemicals, or any combination thereof by a cleavage reaction that does not adversely change the NT film's structure. The linking group comprises 2 to about 20 single or multiple covalent bonds comprising a chain of carbon atoms and, optionally, heteroatoms or a chain of silicon atoms and, optionally, heteroatoms. The polycyclic aromatic groups comprise pyrene, anthracene, pentacene, benzo[a] pyrene, chrysene, coronene, corannulene, naphthacene, phenanthrene, triphenylene, ovalene, benzophenanthrene, perylene, benzo[ghi]perylene, antanthrene, pentaphene, picene, dibenzo[3,4;9,10]pyrene, benzo[3,4]pyrene, dibenzo [3,4;8,9]pyrene, dibenzo[3,4;6,7]pyrene, dibenzo[1,2;3,4] pyrene, naphto[2,3;3,4]pyrene, porphyrin derivatives, or any combination thereof.

Another embodiment of the invention is directed to nanotube (NT) dispersions comprising a plurality of NTs or NT equivalents, a degradable polymeric NT dispersant, and a solvent in which the NTs are dispersed by the dissolved degradable polymeric NT dispersant. The NTs or NT equivalents can be single walled carbon nanotubes (SWNTs), double walled carbon nanotubes (DWNTs), multi walled carbon nanotubes (MWNTs), graphene sheets, or other graphene structures. The dispersion can include other nanoparticles or microparticles. In one embodiment of the invention, the nanoparticles or microparticles can be a material that is not dissolved in the solvent of the dispersion, but is soluble in a second solvent.

Another embodiment of the invention is directed to a method of forming a NT comprising film, where a NT dispersion is deposited on a substrate, the cleavable groups of the degradable polymeric NT dispersant are cleaved, and the solvent and the cleavage residues from the degradable polymeric NT dispersant are removed, although not necessarily in the same step. Deposition can be carried out by air brushing, electrostatic spraying, ultrasonic spraying, ink-jet printing, roll-to-roll coating, or dip coating. Removal of the solvent can be carried out before or after cleavage of the cleavable groups. Promoted cleavage can occur by thermolysis, photolysis, addition of a catalyst, addition of one or more reagents, addition of one or more solvents, or any combination thereof. Removing can be carried out by filtering, washing, or evaporating.

In an embodiment of the invention, a NT comprising film comprises a multiplicity of NTs free of residual dispersants having intimate electrical contact between the NTs throughout the film, and the thickness of the film varies in a predetermined pattern, such as thick NT lines separating thin NT windows. The predetermined pattern can be formed by deposition of at least a portion of the film by one of the deposition methods listed above. For example, the predetermined pattern can be a grid of NTs deposited by ink-jet printing on an approximately uniform thick transparent nanotube film substrate, where the deposited lines are thick relative to the film but have a small width such that very transparent windows of the substrate film are separated by the less transparent or opaque patterned grid. For example, the grid can have a transparency of less than 50% transmittance and the windows can have a transparency in excess of 75% transmittance such that the grid diminishes little of the apparent transparency of the film but improves the conductivity of the film relative to a uniformly thick film lacking the grid.

These and other features and advantages of the present invention will be apparent for those skilled in the art. While numerous changes may be made by those skilled in the art, such changes are within the spirit of the present invention.

DETAILED DESCRIPTION

Embodiments of the invention are directed to an on demand degradable polymeric dispersant for carbon nanotubes (NTs) having a multiplicity of NT associative groups where the dispersant can be removed after formation of a film or other structure by a degradation of the dispersant to individual, monomeric, associative groups that remain after cleavage from the polymer. The associative groups can be polycyclic aromatic units, such as a pyrene units. The NT associative groups bind strongly to the NTs in a cooperative manner when linked via the polymer, where binding of multiple individual NT associative groups keep the NT coupled to the polymers independently of the association or dissociation of any individual NT associative group with the NT. Upon cleavage of cleavable groups, the NT associative groups dissociate from the polymers, allowing the monomeric NT associative groups to undergo an associative/dissociative equilibrium that can be driven to the dissociative form and allow the removal of the NT associative groups from the NTs, which also allows the residual cleaved coupling polymer portion of the polymeric dispersant to be removed from an electrode or any other device comprising the NT film or other NT equivalent structure.

In another embodiment of the invention, a dispersion of NTs, prepared from NTs and the degradable polymeric NT dispersants, is formed that can be used as an ink to form highly conductive printed films of NTs. Printed NT films, according to an embodiment of the invention, can be formed upon removal of the polymeric dispersant that are highly conductive films, which can vary in thickness and transparency over the area of the film, as permitted by the deposition method employed. For example, the printed film can comprise a grid of continuous highly conductive bands of NTs having relatively low transparency framing windows of NTs that are highly transparent, where the conductivity of the windows is high, but lower than that of the bands of the grid. The printed nanotube films can be doped to further enhance their conductivity. Doping can be conducted by any method known in the art and the dopant can be any material known to dope NTs, including, but not limited to: halogens; sulfuric acid; alkali metals; quinones; boranes; bora-tetraazapentalenes; aminium or ammonium salts; sulfonium salts; oxonium salts; selenonium salts; nitrosonium salts; arsonium salts; phosphonium salts; iodonium salts; select metal (e.g. silver) salts; and photoacids, such as di- or multi-aryl sulfonium and iodonium salts.

In an embodiment of the invention, the degradable polymeric NT dispersants comprise a polymer backbone and a pendant group that comprises a polycyclic aromatic group that binds strongly, yet reversibly, to the wall of a carbon NT or other graphene surface, for example, a graphene sheet. The pendant group is attached to repeating units of the polymer backbone and, in some cases, to the ends of a polymer in addition to non-terminal repeating unit of the polymer. The pendant group can be attached to a terminal or non-terminal repeating units of the polymer. The polymer can be a linear, branched, hyperbranched, or dendritic polymer. The polymer can be a homopolymer or a copolymer of two or more different repeating units. The polymer, which can be a copolymer having a plurality of different repeating units, can be any polymer that can be prepared by a step-growth or a chain-growth polymerization, including, but not limited to: polyamides; polyesters; polycarbonates; polyimides; polybutadiene or other non-conjugated polyenes; and polysiloxanes. The polymer may be of natural origin, such as those developed from cellulose. In embodiments of the invention, the polymer backbone comprises heterostructures, such as heteroatoms or carbons having different hybridization, such as isolated ene units, where the polymer backbone can be degraded to facilitate removal of fragments from the polymer other than the fragments that contain a single NT associative group. In an embodiment of the invention, having formed degradable polymeric NT dispersants of one polymer structure, reaction can be carried out on the polymer to form another structure, as can be appreciated by those skilled in the art and illustrated in the exemplary embodiment shown in FIG. 1 for the reduction of a non-conjugated polyene. The degradable polymeric NT dispersants are soluble in at least one solvent when the NT associative groups are attached to the polymer, and the degradation residues, either polymeric, oligomeric, or monomeric species, are soluble in the same or a different solvent. In embodiments of the invention, the polymer can be of low degree of polymerization, for example a trimer, tetramer or even a dimer, and can be referred to as an oligomer or as a polymer. One or more of the NT associative groups can be attached to an end-group of the polymer.

The NT associative groups are attached to a repeating unit of the polymer via a linking group that comprises 2 to about 20 covalent bonds that are either single or multiple bonds. The linking group can be a chain of carbon atoms or combination of carbon atoms and heteroatoms, including, but not restricted to: oxygen; nitrogen; silicon; phosphorous; and sulfur. In another embodiment of the invention, the linking group can comprise a chain of 2 to about 20 covalent bonds between silicon atoms or between silicon atoms with heteroatoms, including, but not restricted to: oxygen; nitrogen; and carbon. In one embodiment of the invention, the linking group comprises 6 to 20 covalent bonds, permitting the decoupling of the polymer backbone's conformation from the NT associative groups binding to the NTs. The cleavable bonds that permit degradation can reside within the polymer backbone or the linking groups. To assure degradability to fragments having only a single NT associative group, the degradable polymeric NT dispersant, according to an embodiment of the invention, has no more than one pendant NT associative group residing on a given repeating unit and the disposition of cleavable bonds is such that only one NT associative group can reside in a degradation fragment after complete degradation of the degradable polymeric NT dispersant by cleavage of all cleavable groups.

NT dispersants used to prepare NT dispersions can have cleavable groups on the pendant groups. A plurality of NT associative groups on a degradable polymeric dispersant can be coupled to a single repeating unit as long as cleavage of all cleavable bonds results in the generation of degradation residues that contain no more than a single NT associative group, where, in this manner, a NT film can form that is effectively free of residual fragments from the NT dispersant. This type of NT dispersant has at least one cleavable group on the linking group or groups per NT associative group attached to the linking group. In an embodiment of the invention, a method of forming a NT film requires degradation with a very high cleavage efficiency, such that upon reaction no pair of NT associative groups remains coupled in a single molecule. Cleavage results in degradation fragments with a single NT associative group.

Although the monomeric NT associative groups can bind to the NTs, the lack of cooperation between a plurality of molecularly coupled NT associative groups after degradation allows their effective removal. This removal allows the remaining NTs to have intimate contact between two unhindered adjacent NTs at, on average, a plurality of sites along any given NT, allowing electrical percolation within the film that gives rise to high conductivities of the NT films. Any NT associative group on the non-degraded polymeric NT dispersant that dissociates from the NT is obliged to remain in the immediate proximity of the NT because of the cooperative binding of a NT with a multiplicity of NT associative groups linked to the same degradable polymeric NT dispersant. An equilibrium state is established with the NT strongly binds to the degradable NT dispersant due to this cooperative binding of a multiplicity of NT associative groups. The decoupled monomeric NT associative groups can diffuse from the NT after degradation of the polymer and/or linking groups and the associative-dissociative equilibrium between that monomeric NT associative group and the NT can be driven to effectively completely dissociate and remove the NT associative groups. For example, multiple washings with a solvent or solution that has an affinity for the monomeric NT associative groups, results in removal of the NT associate groups from a NT film. Effectively, complete dissociation can be considered to occur when a sufficient amount of NT associative groups and other polymeric residues are removed to an extent that every NT can make unhindered contact to at least one other NT, such that the average sized NT has a plurality of contacts within the resulting matrix of a film or other structure. Although absolute removal of all monomeric NT associative groups containing residue from the degradable polymeric NT dispersant is not required, the effectively complete removal will occur in most systems.

In another embodiment of the invention, multiple depositions of NTs can be made on a substrate to form a film or a patterned film, where at least one of the depositions employs a NT dispersion employing one or more degradable polymeric NT dispersants. After degradation of the degradable polymeric NT dispersants, the monomeric NT associative groups can diffuse to portions of the multiply-deposited film that is effectively free of NT associative groups. For example, a portion of the film that was effectively free of NT associative groups, a portion having no NT associative attached in a manner that disrupts electrical connectivity between NTs, can bind with monomeric NT associative groups released from other portions of the film having monomeric NT associative groups in a manner where disruption of existing NT to NT contact does not occur. For example, a NT film according to U.S. Pat. No. 7,776,444, incorporated herein by reference, is a NT associative group free film that can be used as a substrate upon which a patterned NT film is formed by deposition of a degradable NT dispersion using a printing method, which, upon degradation of the NT dispersant on the patterned film, the fragments with monomeric NT associative groups can migrate to the substrate NT film without disrupting the NT to NT association of the substrate NT film.

When used to form a nanotube dispersion, the associative group of the polymeric associative dispersant can be a polycyclic aromatic group that can non-covalently bind to the sidewalls of a carbon NT through pi-stacking. Other non-covalent associative forces can be used to bind with the carbon nanotubes. Unlike covalent bonding, the binding between an associative group and a NT does not disrupt the nanotube structure in a manner that alters or compromises the nanotubes' properties that are derived from the delocalized pi-system. As used herein, the carbon NTs include: single wall nanotubes (SWNTs); multiwall nanotubes (MWNTs); or NT equivalents, including graphene sheets, other graphene structures, or any mixtures comprising NTs and/or NT equivalents.

In an embodiment of the invention, a variety of polycyclic aromatic groups can be used as associative groups of the degradable polymeric NT dispersants. Any one of these polycyclic aromatic groups can be used exclusively or in combination with one or more other structurally different polycyclic aromatic groups as the associative groups of the degradable polymeric NT dispersant. Examples of the polycyclic aromatic groups that can be used for non-covalent binding associative groups include, but are not limited to: pyrene; anthracene; pentacene; benzo[a]pyrene; chrysene; coronene; corannulene; naphthacene; phenanthrene; triphenylene; ovalene; benzophenanthrene; perylene; benzo[ghi]perylene; antanthrene; pentaphene; picene; dibenzo[3,4;9,10]pyrene; benzo[3,4]pyrene; dibenzo[3,4;8,9]pyrene; dibenzo[3,4;6,7]pyrene; dibenzo[1,2;3,4]pyrene; naphto[2,3;3,4]pyrene; and porphyrin derivatives. A polycyclic aromatic associative group can be linked to: every repeating unit of the polymer; alternating repeating units of the polymer; or randomly or regularly linked to three or more repeat units of a polymer. A NT associative group can be linked to one or more terminal ends of the degradable polymeric NT dispersant.

Embodiments of the invention are directed to the preparation of degradable polymeric NT dispersants. Monomeric units that comprise a linked NT associative group may be homopolymerized, as shown for exemplary embodiments in FIGS. 1 and 2, or copolymerized, as shown for exemplary embodiments in FIGS. 3 and 4, by any suitable mechanism including, but not limited to: polycondensation; ring-opening addition polymerization; free radical addition polymerization; anionic addition polymerization; cationic addition polymerization; coordinative ring-opening addition polymerizations; step-growth or chain growth metathesis polymerization; or any other suitable process. The degradable polymer backbone may also be of natural origin, such as those based on cellulose. The structure of the polymeric chain can vary: to accommodate a desired process for using the degradable polymer NT dispersion; to allow deposition of a resulting NT film on a chosen substrate; to achieve desired conditions for deposition; or other considerations. The polymer of the degradable polymer NT dispersant can be water soluble or an organic solvent soluble polymer. The organic solvent can vary and can be a non-polar solvent, such as an aliphatic or aromatic hydrocarbon, a polar aprotic organic solvent, such as tetrahydrofuran or acetone, or a polar protic solvent, such as an alcohol or a diol.

In an embodiment of the invention, the cleavable groups can reside within the backbone within or between every repeating unit containing a NT associative group. Additional cleavable groups can be situated at regular or irregular position within the backbone. In another embodiment of the invention, the cleavage group resides in the linking group between a polymer backbone and a NT associative group. The cleavable group can be any group where the group is stable for preparation and deposition of a NT dispersion, but where conditions can be changed to promote cleavage of the group. The change of conditions can be: a change in temperature; illumination; addition of one or more chemicals that act as a catalyst and/or reagent; addition of a catalyst and additional solvent; or any combination thereof. For example, the cleavage can be due to a thermolytic or photolytic bond breading reaction of the cleavable group, for example, a retro Diels-Alder reaction. The cleavage can be promoted by a catalyst, for example, an acid or base that promotes a solvolysis reaction. The change in conditions can be applied to a film formed from the NT dispersion. In an embodiment of the invention, the change in conditions can include a change of solvent or a change of the solvent concentration that was used for the dispersion with inclusion of a catalyst, such that the polymeric NT dispersion can be in equilibrium with monomers or oligomers, for example, cyclic oligomers, where the proportion of NT associative groups containing repeating units to total repeating units is sufficiently small and can essentially leave only oligomers containing a single NT associative group per oligomer.

For example, in an exemplary embodiment of the invention, the cleavable group is an acetal or ketal that resides within a repeating unit and/or in the linking group to the NT associative group of the degradable polymeric NT dispersant. The NT dispersion formed from this degradable polymeric NT dispersant can be used to form a film and an acidic or basic catalyst can be added. For example, water or an alcohol solvent wetting film is a reagent that results in the cleavage of an acetal or ketal cleavable group. The added acid or base catalyst can be any Bronsted-Lowry or Lewis acid or base. Cleavage liberates monomeric associative groups and allows the simultaneous or sequential removal of the polymeric backbone portion or fragments of the polymeric backbone portion from the polymeric NT dispersant. The monomeric NT associative units may include a portion of the linking group, may include the entire linking group, or may include a portion of the polymer backbone that can be removed simultaneously or sequentially from other residue generated upon cleavage. In another exemplary embodiment of the invention, the cleavable group can be a di-, tri- or tetra-alkoxysilane (silyl ester), or di-, tri- or tetra-silazane where the solvent or polymeric NT dispersant lacks an oxygen nucleophile, such that the alkoxy silane or silazane can undergo subsequent hydrolysis or alcoholysis to liberate monomeric NT associative groups from the polymer backbone, or residues of the polymer backbone, by exposure of the film from the NT dispersion to the nucleophilic oxygen reagent and any appropriate catalyst that is required. In another exemplary embodiment of the invention, the cleavable group can be contained in the backbone of a polymer of natural origin, such as cellulose. According to embodiments of the invention, cleavage is carried out after the nanotube dispersion is deposited as a film and where the cleavage reaction results in little disruption of the NT film structure such that any NT associative group free NT comprising film becomes highly conductive yet of about an equivalent thickness to the film deposited before removal of the NT dispersant. To assure effective contacting of cleavable groups on NT film bound NT dispersants, degradation catalysts that are of a very large molecular weight or are solids are avoided. Therefore polymer bound reagents, enzymes or solid insoluble catalysts are not used to promote cleavage.

In embodiments of the invention, a NT dispersion comprising a liquid vehicle for fluidity, the degradable polymeric NT dispersant, and NTs is formed by the combination of the degradable polymeric NT dispersant, NTs, and a liquid, often referred to as "solvent" herein. The solvent may not truly dissolve the NT dispersions but does dissolve the degradable polymeric NT dispersant when free of the NTs. Due to the cooperative nature of the polymeric NT associative groups, it is possible, in some embodiments of the invention, that the degradable polymeric NT dispersants can be employed in quantities where a single monolayer of the dispersant or even a sub-monolayer of the dispersant on a NT is sufficient to achieve a relatively stable dispersion. The NTs can be single wall nanotubes (SWNTs), multiwall nanotubes (MWNTs), or NT equivalents, such as a graphene sheets or other graphene structures. A NT dispersion can further comprise other nano, micro, or even larger particles that can modify, as desired, the structure or properties of a film or other structural matrix not primarily defined by two dimensions, where the structure is significantly smaller in thickness, a third dimension. The additional particles can modify the ultimate properties of the resulting film or structural matrix. For example, in one embodiment of the invention, metallic nanowires or nanoparticles can be included, where a second dispersant as needed or even sufficient mechanical agitation can be employed to achieve a sufficiently dispersed structure. In another embodiment of the invention, polymeric nanoparticles or microparticles that comprise any shape or mixture of shapes, for example, sphere, rod, or disc, can be included in the NT dispersion. The polymeric nanoparticles can be employed in the final structure, or can be removed by dissolving in a solvent that is not the liquid vehicle used for the dispersion.

In other embodiments of the invention, the NT dispersants used to form a NT film can have a plurality of NT associative groups, as defined previously, attached via a linking group, as defined previously, to a single repeating unit of a polymer, and where the cleavable group, as defined previously, resides in the linking group. Although such dispersants are potentially problematic for the degradation process because of potential steric inhibition of the cleavage reaction by the associated NT, such NT dispersants can be used when the cleavable group is symmetric, for example, a flat ester group or an ene, where the NT associative group cannot oblige a preferred face of the cleavable group to be shielded by the NT to which it is associated. Again, solid or high molecular weight catalysts or reagents are avoided for the cleavage reaction to promote cleavage of all cleavable bonds and achieve easy removal of fragments comprising a single NT associative group. For example a pyrene-containing hydroxypropyl cellulose derivative (HPC-Py) as disclosed in Yang et al. Ind. Eng. Chem. Res. 2010, 49, 2747-51, incorporated by reference herein, can be employed as the NT dispersant, although the disclosed method of cleavage by an enzyme must be avoided as Yang et al suggests that an enzyme was incapable of generating monomeric NT associative cleavage fragments even when the NT dispersion is not deposited as a film.

The NT dispersion can be applied to a surface of any material. In an embodiment of the invention, the NT dispersion can be applied to a surface that can be: a transparent or opaque material; a resistant, semiconductive, or conductive material; or a soluble or insoluble material. For example the surface can be the surface of a plastic, glass, ceramic, semiconductor, or metal. The surface can be flat or have different elevations relative to a hypothetical flat base, and can be considered smooth or rough at dimensions that are small relative to those of any pair of defined elevations. In an embodiment of the invention, the NT dispersion is applied to the surface by any brushing, spraying, printing or coating process. For example air brushing, electrostatic spraying, ultrasonic spraying, ink-jet printing, roll-to-roll coating, rod coating, or dip coating can be employed to deposit a film. The liquid vehicle can be removed to leave a film comprising the NTs associated to the degradable polymeric NT dispersant and the environment of this film modified to promote cleavage reactions that leave a film comprising NTs but is not associated to any NT associative groups that are not monomeric in nature. The residual degradation products can be removed from the NT comprising film by washing and/or evaporating the degradation products and liquids employed for the steps of deposition, degradation, or removal.

The NT dispersion can be deposited, for example, by spraying onto a substrate, where the liquid vehicle is a single solvent or a mixture of solvents that is compatible with the substrate. It is desirable that the NT dispersion exhibits stability for at least several hours, days, or weeks for production of a NT comprising film in a mode where reservoirs feeding a sprayer, printer or coater or a bath for dip coating the film on a substrate need not be immediately prepared prior to deposition. The NT dispersant is then removed from the NTs in a manner that does not damage the nanotubes or the supporting substrate, and does not delaminate the nanotubes from the substrate. For example, if removal requires heating, the heating is carried out in a controlled manner to avoid formation of voids due to rapid expansive loss of gaseous products. Decomposing and/or depolymerizing the NT dispersant should be carried out under conditions that do not promote reactions involving bonds of the NTs. Decomposition can be carried out chemically upon: introduction of a catalyst and/or reagent, for example, a dilute acidic or basic solution; illumination, for example, from a coherent or incoherent light source at visible or ultraviolet portions of the electromagnetic spectrum; or heating to cause thermal decomposition, for example, in an oven with controlled heating and pressure. Removal of the decomposition products can involve washing or vaporizing to leave a NT dispersant free conductive NT film. Because the decomposition and removal have been carried out without generation of voids, pores, or gaps, intimate nanotube to nanotube contact can be maintained or form and yield the desired dispersant free low sheet resistance NT comprising film.

In one exemplary embodiment of the invention, NTs are suspended in water using a surfactant, such as, but not limited to, Triton-X 100, and the NT dispersant in solution is added to the NT suspension to form the NT dispersion. The solvent can be water, a water soluble solvent, or a water insoluble solvent. Upon mixing, the NT dispersant displaces some or all of the surfactant at the NT surface due to the superior NT binding affinity of the NT dispersant's NT associative group, which is further promoted by the multiplicity of NT associative groups. As needed, the suspension can be heated in a controlled manner, or a reagent can be added that has a higher affinity for the surfactant than the NTs but has lesser affinity for the NT dispersant than does the NTs. The NT dispersion formed upon mixing is subsequently filtered and washed to remove surfactant and any free excess NT dispersant; leaving the NT dispersion in a form for application to a substrate upon addition of the desired solvent or solvent mixture to the NT dispersion, generally, but not necessarily, with agitation.

In another embodiment of the invention, NTs that are suspended in water using a surfactant are filtered and washed with water to remove excess surfactant to leave a NT film where the NTs are not deposited with any imposed orientation within the plane of the filter. NT dispersions can be formed by addition of a desired solvent and a polymeric NT dispersant to the NT film without drying the film or after drying the film. The formation of the NT dispersion can be promoted by stirring at a prescribed temperature or a profile of increasing and/or decreasing temperatures, and possibly refluxing the solvent under an air or inert atmosphere, for example, an argon or nitrogen atmosphere.

In an embodiment of the invention, the films can be deposited such that the NTs are homogeneously dispersed over the surface to which they are deposited. In another embodiment of the invention, a pattern of NTs can be formed when employing appropriate deposition techniques, such as printing, or by a series of depositions of NT films where the area of deposition can be controlled over the area to a sufficient tolerance. In this manner, according to an embodiment of the invention, a patterned film can have varied thickness over the area of the surface of the film in a predetermined fashion. For example, a series of lines or a grid of NT comprising lines, which are thin in the plane of the film but are relatively thick perpendicular to the plane, can be used to connect continuous thin transparent NT comprising windows, such that the NT comprising lines are very highly conductive but are of low transparency or are opaque. In this manner the NT comprising lines electrically connect very transparent NT comprising windows of lower conductivity such that the overall conductivity is very high but where the overall loss of transparency over the entire grid is low relative to the same mass of NTs dispersed evenly over the entire film's surface. As can be appreciated by those skilled in the art, the deposition can employ any method where the NT dispersion can be placed on a specific area at a specific concentration, or where a specific area can be over printed one or more times to achieve a desired profile of NT film thicknesses, for example, by using the NT dispersion as a NT ink for printing the patterned film. For example, a grid of lines of low transmittance NTs, for example, less than 50% transmittance, can be printed over a first deposited homogeneous thin NT film such that the printed lines account for less than 10 percent of the area of the film and contact the underlying thin film to form windows of NTs having greater than 85% transmittance that account for more than 90% of the area of the film, where the resulting patterned film displays an improved conductivity and transparency relative to a uniformly thick homogeneous film of the same mass of nanotubes.

Materials and Methods

Preparation of 6-bromohexan-1-ol

Figure 5:
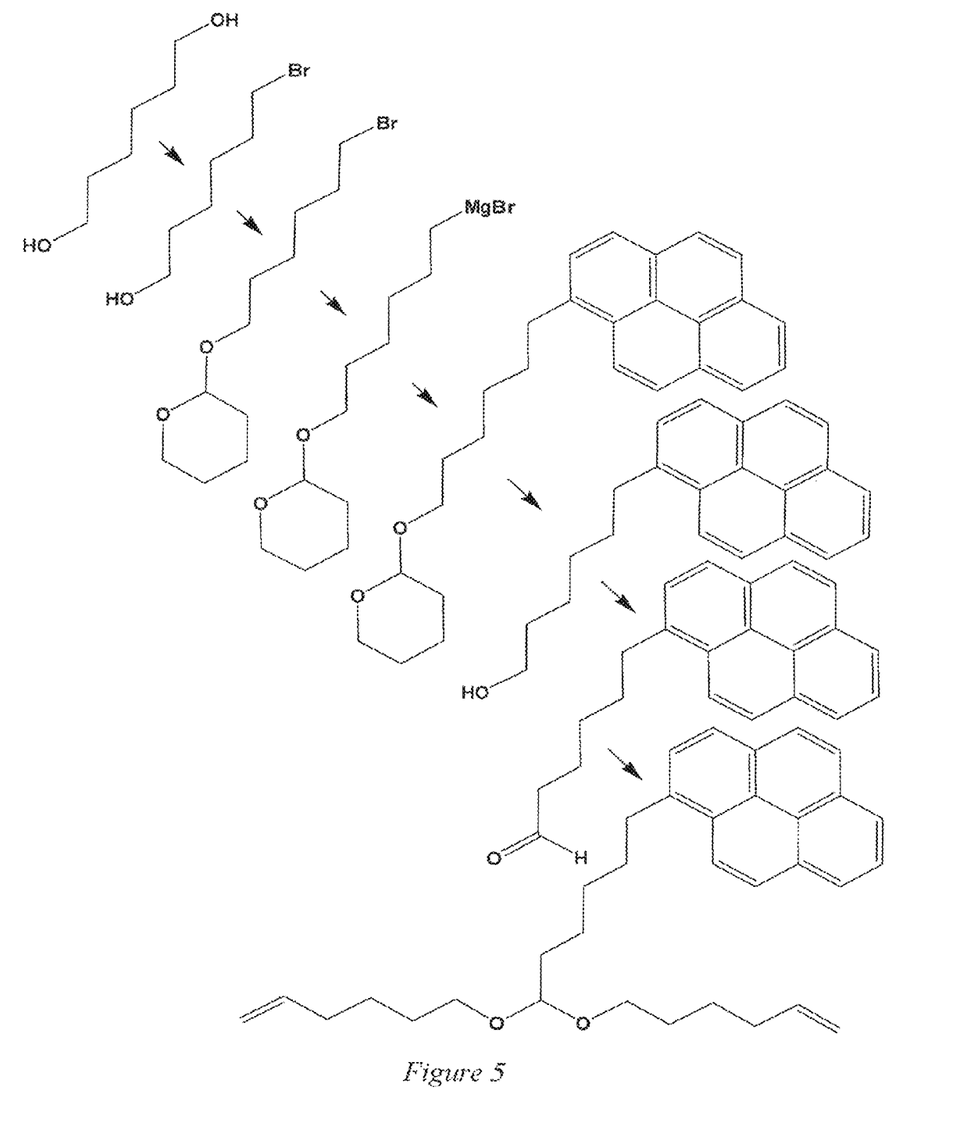
FIG. 5 shows a reaction scheme for the synthesis of an acetal monomer for the preparation of a degradable polymeric NT dispersant via an ADMET polymerization, according to embodiments of the invention.

To carry out the first transformation shown in FIG. 5, hexan-1,6-diol (60 g, 0.25 mol) was added to a 1 L 3-necked flask and placed under a nitrogen atmosphere. To this flask was added toluene (600 mL) and concentrated HBr (66 mL of a 48% (9M) aqueous solution). The mixture was heated under reflux for a period of 36 hours using thin layer chromatography (TLC) to monitor conversion. After cooling the reaction mixture to room temperature, two separate phases formed. The organic phase was diluted with diethyl ether and washed with 1 M NaOH and brine. The organic portions were isolated and dried using anhydrous magnesium sulphate. Removal of the solvent in vacuo resulted in a yellow oil that was distilled under vacuum at 110-120.degree. C. to yield 38 g (84% yield) of 8-bromooctan-1-ol.

Preparation of 2-(6-bromohexyloxy)tetrahydro-2H-pyran

To carry out the second transformation shown in FIG. 5, 8-bromooctan-1-ol (20.00 g, 0.096 mol) was transferred to a 1 L 3-necked flask and placed under a nitrogen atmosphere and dissolved in 200 mL of degassed diethyl ether. Ferric perchlorate (1.06 g, 3.times.10.sup.-3 mol) and 2,3-dihydropyran (THP) (12.09 g, 0.144 mol) were added to the flask. The mixture was stirred at room temperature for 1.5 hours, with the reaction progress followed by TLC. The reaction mixture was passed through a short column of silica gel using petroleum ether as eluent. The solvent was evaporated to dryness to afford 22.23 g (87% yield) of 2-(6-bromohexyloxy)tetrahydro-2H-pyran.

Preparation of (6-((tetrahydro-2H-pyran-2-yl)oxy) hexyl)magnesium Bromide

To carry out the third transformation shown in FIG. 5, a 500 mL, 3-necked flask was dried overnight in an oven and charged with 10.00 g (416 mmol) of magnesium turnings and a magnetic stirrer bar. The magnesium was dried under a rapid stream of argon while heated by a heat gun. After cooling to room temperature, the rate of argon flow was reduced and 200 ml of anhydrous nitrogen degassed diethyl ether was added via a syringe to the reaction vessel. To the reaction vessel was slowly added 10 mL of argon degassed 1,2-dibromoethane. The mixture was stirred at room temperature for one hour followed by stirring at reflux for an additional 1 hour, where ether reflux resulted from the exothermic reaction with the eroding magnesium surface. A small crystal of iodine was added to the vessel. A clear black solution resulted which decolored after reflux for an hour. A solution of 10.00 g (37.72 mmol) of 2-((6-bromohexyl)oxy) tetrahydro-2H-pyran in 20 mL of anhydrous THF was added drop wise via syringe. After complete addition, the mixture was refluxed for two hours to form a Grignard reagent solution.

Preparation of 2-((6-(5a.sup.1,8a-dihydropyren-1-yl) hexyl)oxy)tetrahydro-2H-pyran To carry out the fourth transformation shown in FIG. 5, 10 g (35.60 mmol) of 1-bromopyrene and 0.2 g (1 mmol) of 1,2-bis(diphenylphosphino)ethane nickel(II) chloride were dissolved in 150 mL of anhydrous diethyl ether and the mixture brought to reflux. The Grignard reagent solution was transferred via syringe to the reaction vessel. The reaction mixture was heated under reflux for two hours. After cooling to room temperature, the reaction was poured into deionized water and extracted using dichloromethane. The isolated organic solution was dried using magnesium sulphate. Pure pyrene THP ether, 9.42 g (68% yield), was obtained by column chromatograph using a 1:1 dichloromenthane:hexane mixture followed by removal of the solvent.

Preparation of 6-(5a.sup.1,8a-dihydropyren-1-yl)hexan-1-ol

To carry out the fifth transformation shown in FIG. 5, a mixture of 5.78 g (14.90 mmol) of the pyrene THP ether and 0.40 g (1.12 mmol) of Fe(ClO.sub.4).sub.3 were stirred in 80 mL of a equivolume mixture of MeOH and Toluene at 50.degree. C. for 12 hours with progress of the reaction monitored by TLC. After completion of the reaction, the solvents were evaporated in vacuo and 4.15 g, (92% yield) of the pure pyrene alcohol was isolated by column chromatography using dichloromethane as solvent after evaporation of the solvent.

Preparation of 6-(5a.sup.1,8a-dihydropyren-1-yl)hexanal

To carry out the sixth transformation shown in FIG. 5, 20 mL of anhydrous dichloromethane was transferred to a 3 neck round bottom flask under argon and cooled to −78.degree. C. using a dry ice/acetone bath and 1.71 mL (24.1 mmol) of dimethylsulfoxide was added. Via a syringe, 1.39 mL (16.2 mmol) of oxalyl chloride was added dropwise into the vessel and the mixture was stirred for 30 minutes. A solution of 2.41 g (7.89 mmol) of the pyrene alcohol in 50 mL of dichloromethane was added dropwise to the mixture over 5 minutes. The resulting highly viscous mixture was stirred for 40 minutes at −78.degree. C. and 10 mL of anhydrous triethylamine was added slowly. The yellow mixture was warmed to room temperature, diluted with 150 mL of dichloromethane, and washed three times with 50 mL of water. The organic layer was collected and dried using magnesium sulphate. After evaporation of the solvents, 1.89 g (80% yield) of a solid white pyrene aldehyde product was isolated.

Preparation of 6-(6,6-bis(hex-5-en-1-yloxy)hexyl)-3a,3a.sup.1-dihydropyrene

To carry out the final transformation shown in FIG. 5, 2.00 g, (6.66 mmol) pyrene aldehyde was transferred to a 100 mL three neck round bottomed flask under an argon atmosphere and dissolved in 40 mL of dry tetrahydrofuran. To the flask was added 2.92 g (26.6 mmol) 5-hexen-1-ol and 0.92 g (6.7 mmol) of HO.sub.3S—SiO.sub.2. Preparation of the HO.sub.3S—SiO.sub.2 is given below. The mixture was refluxed under the argon atmosphere for 24 hours. Solvent was evaporated from the mixture and the resulting yellow oil was heated under vacuum at 50.degree. C. to remove residual 5-hexen-1-ol. The acetal monomer was isolated using column chromatography employing a 1:1 dichloromethane:hexane mixture.

The HO.sub.3S—SiO.sub.2 supported acid catalyst was prepared in the following manner. To a solution of 20 mL of ethanol and 15 mL of deionized water was added 9.33 g (44.8 mmol) of tetraethylorthosilicate (Si(OEt).sub.4) and 0.84 g (3.6 mmol) of 3-mercaptopropyltriethoxysilane. The mixture was stirred for 2 hours at reflux. A wet gel was separated from the liquid by evaporation in vacuo and isolated as a white solid. The gel was transferred to a 100 ml 3-neck round bottom flask, to which 30 mL of acetonitrile and subsequently 5 mL of 31% aqueous hydrogen peroxide solution were added. The mixture was heated to reflux for a period of six hours. The resulting white gel was filtered and washed with deionized water and subsequently with ethanol. After drying in vacuo for about 30 minutes, the white solid gel was transferred to a 500 ml round bottom flask and 100 mL of aqueous 0.1 M sulfuric acid was added. The mixture was stirred for one hour. The solid was filtered and washed with deionized water until the resulting slurry displayed a neutral pH. The solid HO.sub.3S—SiO.sub.2 supported acid catalyst was isolated and dried in a vacuum oven at 100.degree. C. for 6 hours before use.

Figure 1:
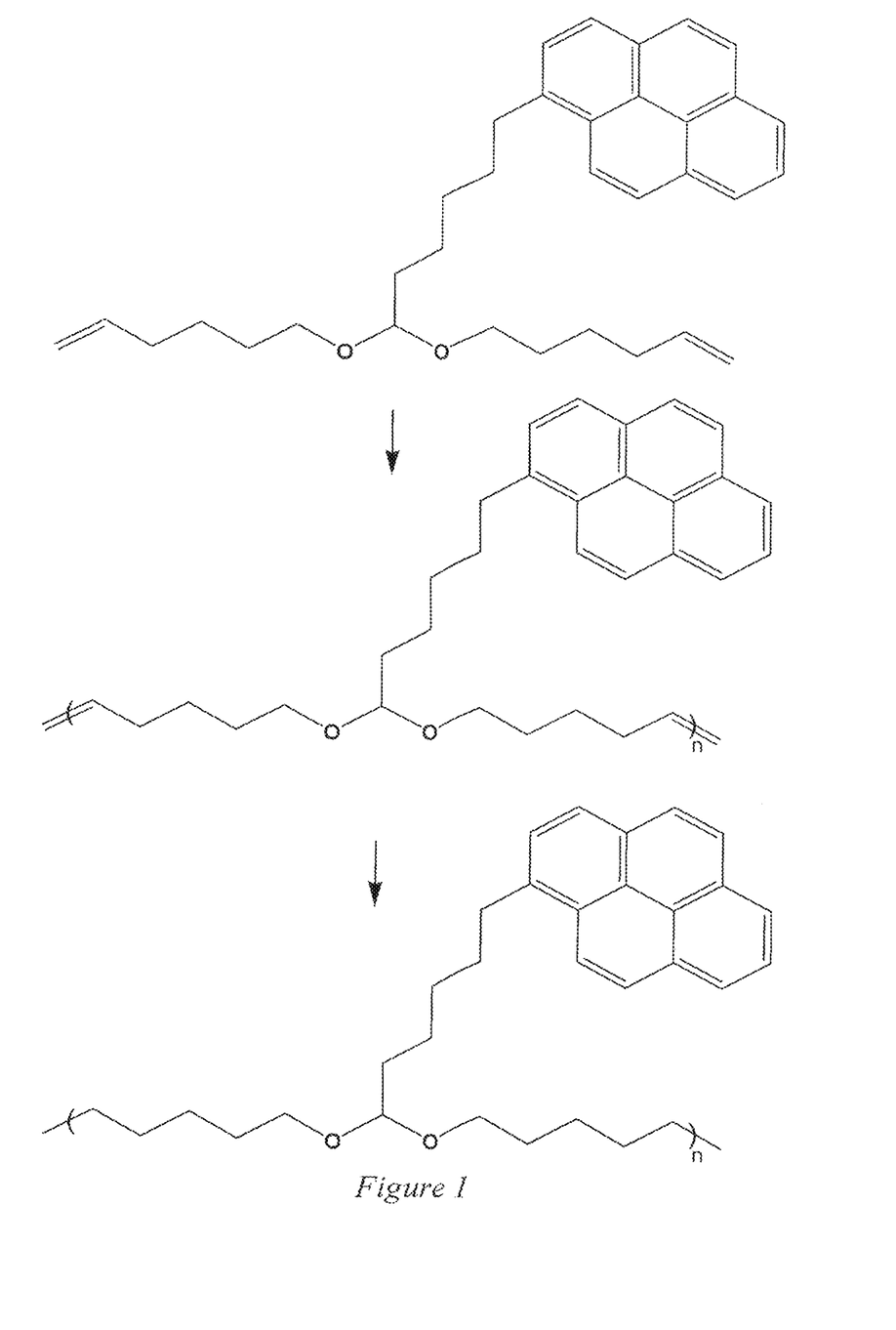
FIG. 1 shows a reaction scheme for the homopolymerization of an acetal monomer to form an organic solvent soluble degradable polymeric NT dispersant via an ADMET polymerization, according to an embodiment of the invention, and reduction of the ADMET formed ene comprising polymer to a saturated polymer, according to an embodiment of the invention.
Figure 2:
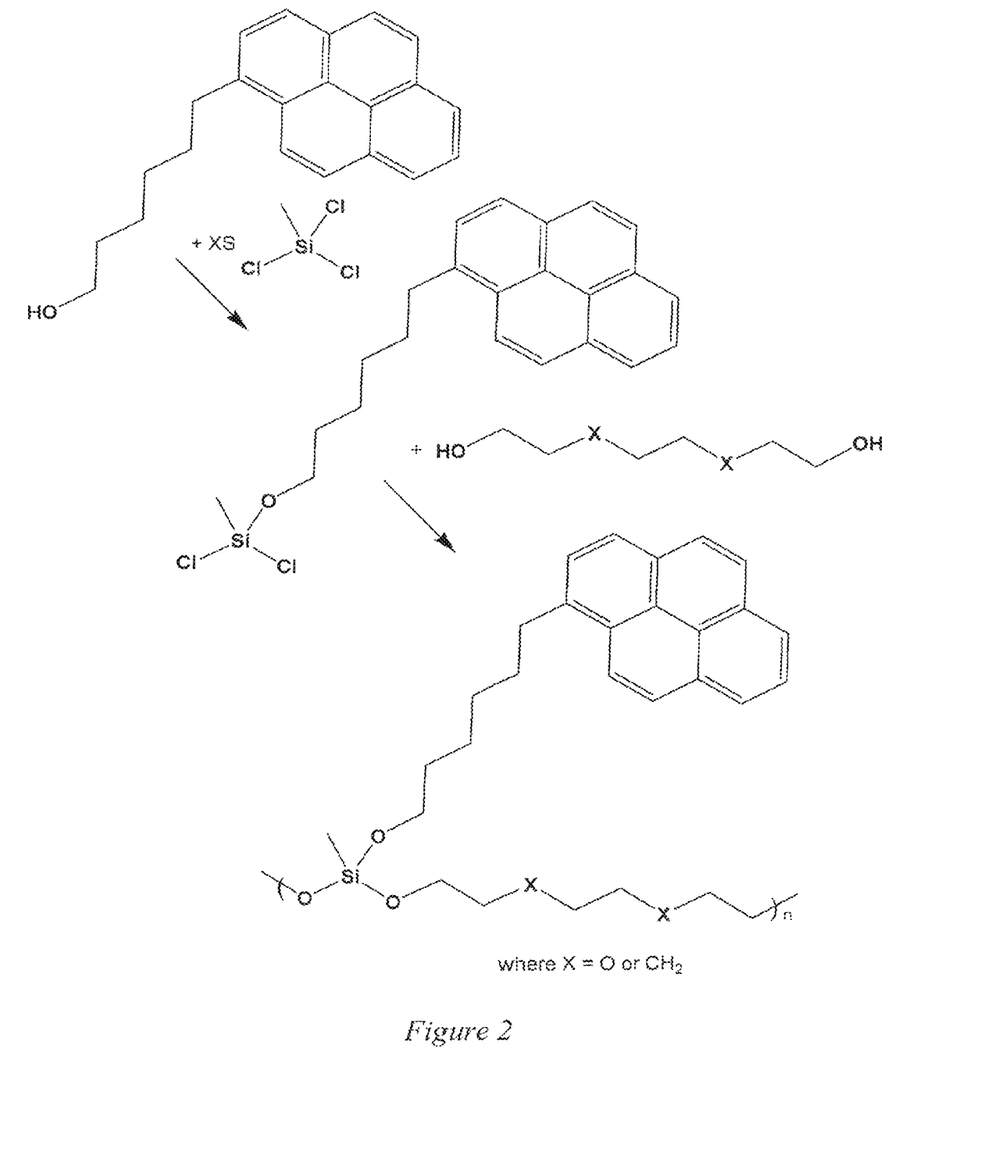
FIG. 2 shows a reaction scheme for the formation of a monomer and its subsequent polymerization to a degradable polymeric NT dispersant via alkoxysilane formation, according to an embodiment of the invention.

Homopolymerization of 6-(6,6-bis(hex-5-en-1-yloxy)hexyl)-3a,3a.sup.1-dihydropyrene Prior to polymerization as shown in FIG. 1, 100 mg (0.20 mmol) of the acetal monomer was dried under vacuum at 50.degree. C. for 12 hours, dissolved in 0.5 mL of degassed dichlorobenzene, and the monomer solution was degassed with argon for one hour. The monomer solution was transferred using a cannula to a Schlenk tube containing 1.65 mg (2.01.times.10.sup.-3 mmol) of Grubbs' 1.sup.st generation catalyst (1 mol %) that had been dried under vacuum overnight. The polymerization mixture was stirred under a vacuum of 70 Torr at 45.degree. C. for four days. The reaction was quenched by addition of 1 mL of ethyl vinyl ether in 5 mL of dichlorobenzene and the polymer was isolated as a gum by precipitation in non-acidic methanol to remove catalyst residue and any unconverted monomer.

Preparation of 2,5-dibromobenzene-1,4-diol

Figure 6:
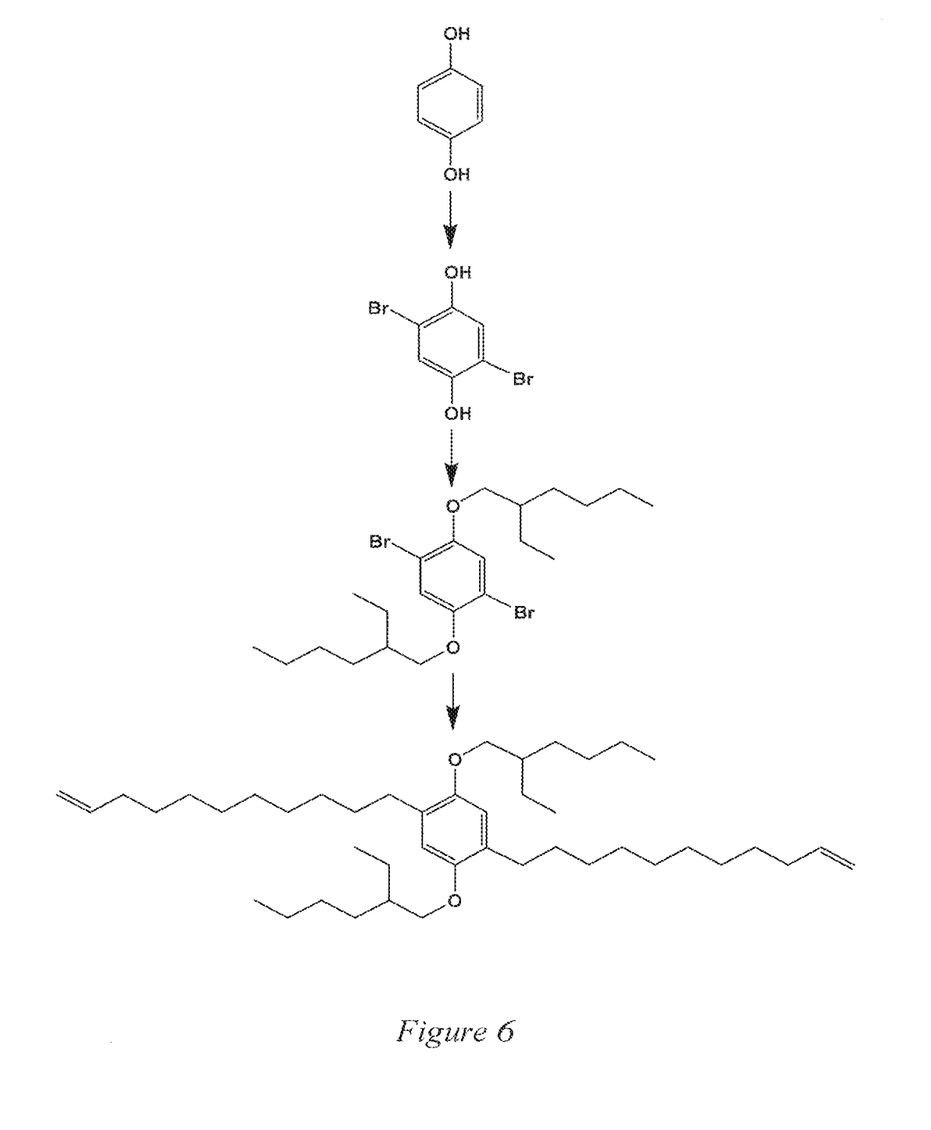
FIG. 6 shows a reaction scheme for the synthesis of an .alpha.,.omega.-diene monomer for copolymerization with an acetal monomer for the preparation of a degradable polymeric NT dispersant with enhanced organic solvent solubility via an ADMET copolymerization, according to embodiments of the invention.

To carry out the first transformation shown in FIG. 6, a solution of 90.61 g (0.57 mol) of bromine in 20 mL of glacial acetic acid was added dropwise over three hours to a stirred suspension of 30 g (0.27 mol) hydroquinone in 200 mL of glacial acetic acid at room temperature. The stirred reaction mixture displayed a mild exotherm with the temperature rising to approximately 30.degree. C. which was accompanied by the formation of a clear solution followed by precipitation of a colorless solid after 5-10 minutes. Stirring was continued overnight. The solid was isolated by filtration and washed with a small amount of glacial acetic acid. The filtrate was concentrated in vacuo to about half its original volume and chilled for 30 minutes. The solid was washed with hexanes to remove residual acetic acid to yield 39.35 g (55%) of 2,5-dibromobenzene-1,4-diol.

Preparation of 1,4-dibromo-2,5-bis((2-ethylhexyl)oxy)benzene

To carry out the second transformation shown in FIG. 6, a suspension of 28.34 g (0.11 mol) or 2,5-dibromobenzene-1,4-diol, 40.91 g (0.13 mol) of 2-ethylhexylbromide, and 58.56 g (0.42 mol) of potassium carbonate in 500 mL of acetonitrile was heated to reflux for 48 hours under nitrogen. The mixture was poured into 500 mL of deionised water and the resulting suspension was filtered using celite and dissolved in dichloromethane. Removal of the solvent resulted in a residual dark brown oil. The oil was dissolved in hexane and purified via column chromatography. The solvent was removed under reduced pressure leaving a clear oil. The oil contained residual 2-ethylhexyl bromide, which was removed by vacuum distillation using a Kuglerohr at 70.degree. C. for two hours to give 32.87 g (61% yield) of 1,4-dibromo-2,5-bis((2-ethylhexyl)oxy)benzene.

Preparation of 1,4-bis((2-ethylhexyl)oxy)-2,5-di(undec-10-en-1-yl)benzene

To carry out the final transformation shown in FIG. 6, 1.00 g (2 mmol) of 1,4-dibromo-2,5-bis((2-ethylhexyl)oxy) benzene was placed in a 250 mL 3-neck round bottomed flask and 20 mL of anhydrous tetrahydrofuran was added under an argon atmosphere. The resulting solution was cooled to −78.degree. C. using a dry ice and acetone bath. Using a syringe, 2.17 mL of a 2.3 M n-BuLi in hexane (5 mmol n-BuLi) was added dropwise and the mixture was stirred for 30 minutes. To the mixture, 1.39 g (6 mmol) of 11-bromoundec-1-ene dissolved in 5 mL of tetrahydrofuran was added dropwise using a syringe. The mixture was stirred overnight at room temperature. The mixture was poured into de-ionised water and extracted with dichloromethane. The organic portions were combined and dried with anhydrous magnesium sulfate.

Figure 3:
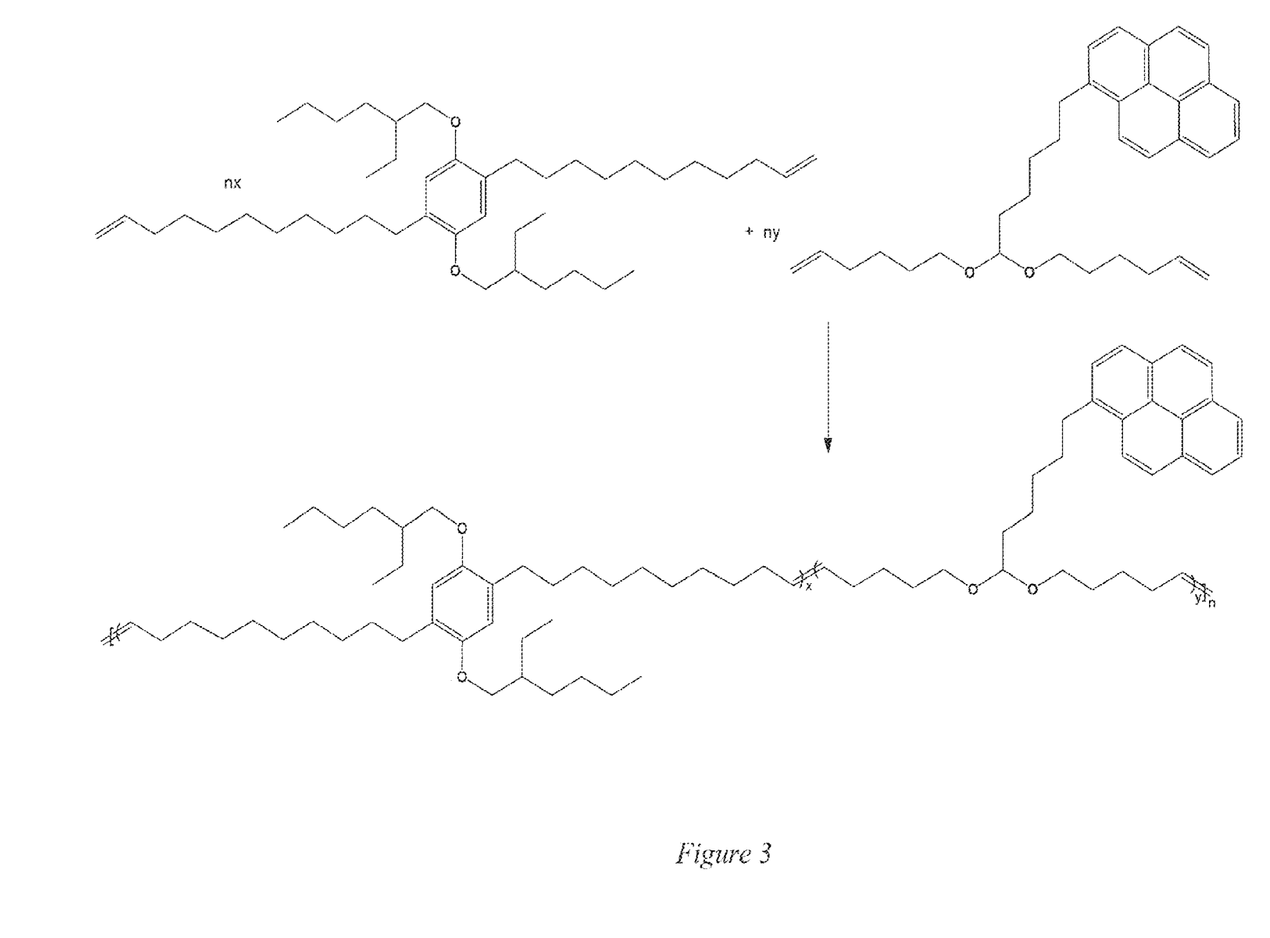
FIG. 3 shows a reaction scheme for the formation of a degradable polymeric NT dispersant with enhanced organic solvent solubility via an ADMET copolymerization, according to an embodiment of the invention.
Figure 4:
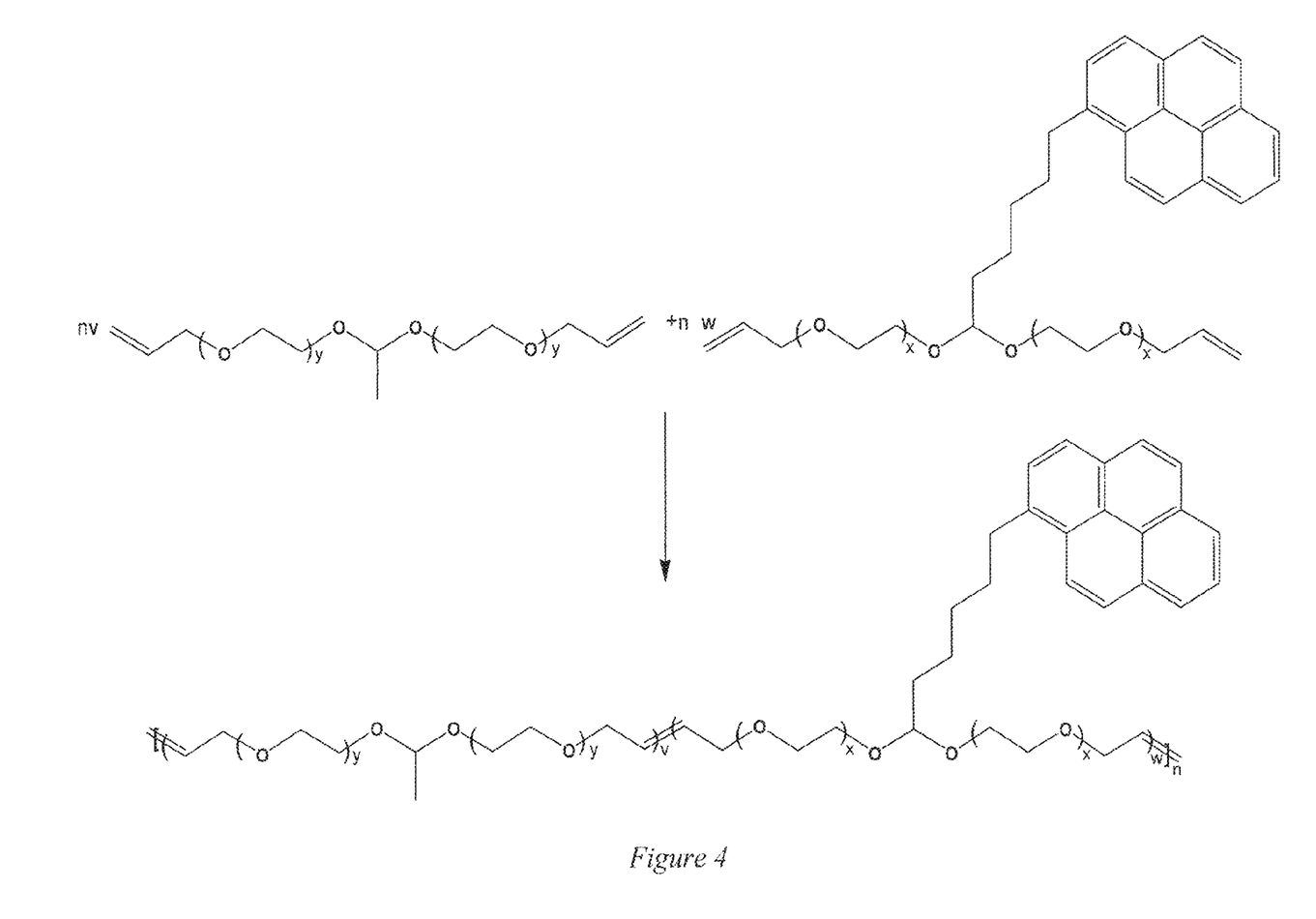
FIG. 4 shows a reaction scheme for the formation of a water soluble degradable polymeric NT dispersant via an ADMET copolymerization, according to an embodiment of the invention.

Random Copolymerization of 6-(6,6-bis(hex-5-en-1-yloxy)hexyl)-3a,3a.sup.1-dihydropyrene with 1,4-bis((2-ethylhexyl)oxy)-2,5-di(undec-10-en-1-yl) benzene As shown in FIG. 3, a mixture of 1.00 g (2.07 mmol) of 6-(6,6-bis(hex-5-en-1-yloxy)hexyl)-3a,3a.sup.1-dihydropyrene and 1.32 g (2.07 mmol) of 1,4-bis((2-ethylhexyl)oxy)-2,5-di(undec-10-en-1-yl)benzene was dried under vacuum for 48 hours and transferred to a Schlenk tube equipped with a magnetic stirring bar under an argon atmosphere. A 5.67 mg (0.0069 mmol) quantity of Grubbs' 1.sup.st generation catalyst was transferred to the tube to form a 300/1 monomer/catalyst mixture that was stirred under vacuum at 45.degree. C. for four days. As shown in FIG. 4, the polymerization reaction was quenched by addition of 10 mL ethyl vinyl ether, and the copolymer was precipitated by addition to acidic methanol and isolated as an adhesive gum upon removal of the methanol solution.

Figure 7:
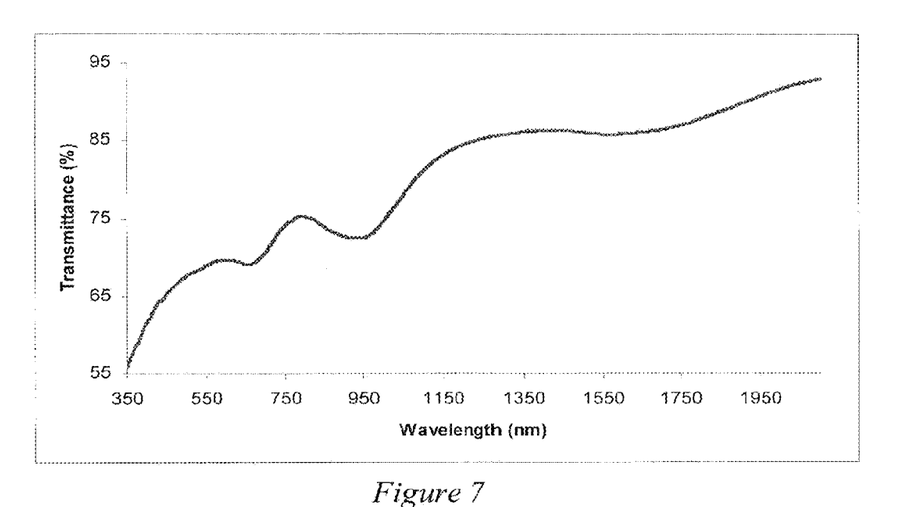
FIG. 7 is a Visible-NIR spectrum of a 60 to 65 nm thick NT comprising film prepared by acid catalyzed degradation of cleavable groups in the linking group between a pyrene associative group and a hydroxypropyl cellulose NT dispersant where the film was deposited by spraying a NT dispersion onto a glass substrate, according to an embodiment of the invention.
Figure 8:
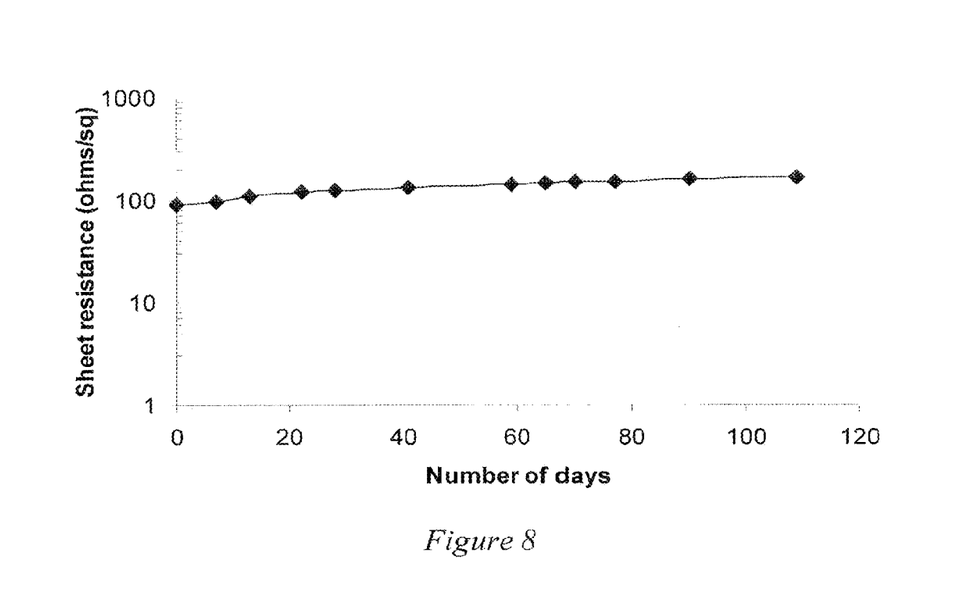
FIG. 8 is a plot of the sheet resistance over time of the NT film having the visible-NIR spectrum of FIG. 7.

Pyrene substituted hydroxypropylcellulose (HPC-Py) was mixed with a suspension of SWNTs in water, where the monomeric surfactant Triton-X 100 (Polyethylene glycol mono [4-(1,1,3,3-tetramethylbutyl)phenyl]ether) was use to form the NT suspension. The suspension was filtered and washed to remove the Triton-X 100 liberated upon addition of the HPC-Py. Various NT-HPC-Py dispersions were prepared by the addition of water, ethanol, or an ethanol/water mixture. The ethanol NT-HPC-Py dispersion was sprayed uniformly on a glass substrate and the resulting film was warmed to 80.degree. C. to evaporate the ethanol. The resulting film was deposited on the glass with no apparent voids. The HPC-Py was decomposed by placing a 10 mM sulfuric acid solution on the film. Subsequently, the cleavage fragments were removed from the NT dispersant free NT film by washing the film with deionized water. The UV-visible spectrum of the resulting NT film displayed optical transparency of 70% at 550 nm, as shown in FIG. 7. Sheet resistance measurement for the 60 nm thick SWNT film shows similar properties to that of a NT film prepared using the filtration method disclosed in U.S. Pat. No. 7,261,852, which is incorporated herein by reference. The SWNT film displays long term stability where the sheet resistance changed from 91.OMEGA./.quadrature. to only 167.OMEGA./.quadrature. after four month of exposure to ambient air without any encapsulation, as shown in FIG. 8.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. A method of preparing a nanotube (NT)-comprising film, comprising:
   providing an NT dispersion comprising a plurality of NTs or NT equivalents, a solvent, and a degradable polymeric NT dispersant comprising:
      a soluble polymer or copolymer comprising a polymer backbone with a multiplicity of repeating units comprising:
         an NT associative group comprising a polycyclic aromatic group capable of non-covalent association with an NT or NT equivalent;
         a linking group coupling the polymer backbone to the NT associative group; and
         at least one cleavable group residing in the polymer backbone or in the linking group, wherein each of the NT associative groups is separated from each other by at least one of the cleavable groups;
   depositing the NT dispersion on a substrate as a film;
   promoting cleavage of the cleavable groups by changing one or more conditions of the film to form cleaved residues of the degradable polymeric NT dispersant;
   removing the cleaved residues from the degradable polymeric NT dispersant; and
   removing the solvent.

2. The method of claim 1, wherein depositing comprises air brushing, electrostatic spraying, ultrasonic spraying, ink-jet printing, roll-to-roll coating, or dip coating.

3. The method of claim 1, wherein promoting cleavage comprises thermolysis, photolysis, addition of a catalyst, addition of one or more reagents, addition of one or more solvents, or any combination thereof.

4. The method of claim 1, wherein removing comprises filtering, washing, or evaporating.

5. The method of claim 1, wherein the at least one cleavable group comprises an acetal, a ketal, a silyl ester, a silazane, an ester, an ether, an anhydride, and/or an ene.

6. The method of claim 1, wherein the at least one cleavable group resides in the polymer backbone.

7. The method of claim 1, wherein the at least one cleavable group resides in the linking group.

8. The method of claim 1, wherein the NTs or NT equivalents comprise single-walled carbon nanotubes (SWNTs), double-walled carbon nanotubes, multi-walled carbon nanotubes (MWNTs), graphene sheets, and/or other graphene structures.

9. The method of claim 1, wherein the polycyclic aromatic groups comprise pyrene, anthracene, pentacene, benzo[a]pyrene, chrysene, coronene, corannulene, naphthacene, phenanthrene, triphenylene, ovalene, benzophenanthrene, perylene, benzo[ghi]perylene, anthanthrene, pentaphene, picene, dibenzo[3,4;9,10]pyrene, benzo[3,4]pyrene, dibenzo[3,4;8,9]pyrene, dibenzo[3,4;6,7]pyrene, dibenzo[1,2;3,4]pyrene, naphtho[2,3;3,4]pyrene, porphyrin derivatives, or any combination thereof.

10. The method of claim 1, wherein the polymer backbone comprises at least two repeating units formed by a step-growth or chain-growth polymerization with a degree of polymerization of at least two.

11. The method of claim 1, wherein the polymer backbone comprises cellulose or another polymer of natural origin.

12. The method of claim 1, wherein the linking group comprises about 2 to about 20 covalent bonds.

13. The method of claim 12, wherein the linking group comprises a chain of carbon atoms or a chain comprising carbon atoms and one or more heteroatoms.

14. The method of claim 13, wherein the one or more heteroatoms comprise oxygen, nitrogen, silicon, phosphorus, and/or sulfur.

15. The method of claim 12, wherein the linking group comprises a chain of silicon atoms or a chain comprising silicon atoms and one or more heteroatoms.

16. The method of claim 15, wherein the one or more heteroatoms comprise oxygen, nitrogen, and/or carbon.

17. The method of claim 1, wherein the solvent comprises water, $C_1$ to $C_6$ alcohol, dichloromethane, tetrahydrofuran, ethyl acetate, acetone, dimethylformamide, acetonitrile, dimethylsulfoxide, hexane, benzene, toluene, chloroform and diethyl ether, or any combination thereof.

18. The method of claim 1, wherein the NT dispersion further comprises a nanoparticle or microparticle.

19. The method of claim 18, wherein the nanoparticle or microparticle comprises a conductive, semiconductive, or insulating material.

20. The method of claim 19, wherein the insulating material is a material insoluble in the solvent of the dispersion but soluble in a second solvent.

* * * * *